US006538885B1

(12) United States Patent
Azar

(10) Patent No.: US 6,538,885 B1
(45) Date of Patent: Mar. 25, 2003

(54) ELECTRONIC CIRCUIT COOLING WITH IMPINGEMENT PLATE

(75) Inventor: Kaveh Azar, Westwood, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/662,995

(22) Filed: Sep. 15, 2000

(51) Int. Cl.[7] .................................................. H05K 7/20
(52) U.S. Cl. .................... 361/695; 165/104.34; 361/796
(58) Field of Search ........................ 165/80.3, 908, 165/104.33, 104.34; 174/15.1, 16.1; 211/41.17; 312/236; 62/414, 418, 419; 361/689–695, 717–719, 796, 800; 454/184

(56) References Cited

U.S. PATENT DOCUMENTS

| 3,804,159 A | * | 4/1974 | Searight et al. .......... 165/109.1 |
| 4,399,484 A | * | 8/1983 | Mayer ........................ 361/689 |
| 4,674,004 A | * | 6/1987 | Smith et al. ................. 361/694 |
| 4,851,965 A | * | 7/1989 | Gabuzda et al. ............ 361/691 |
| 5,196,989 A | * | 3/1993 | Zsolnay ...................... 361/796 |
| 5,210,680 A | * | 5/1993 | Scheibler .................... 361/695 |
| 5,291,570 A | * | 3/1994 | Filgas et al. .................. 385/78 |
| 5,372,543 A | * | 12/1994 | Steele ........................ 454/184 |
| 5,718,117 A | * | 2/1998 | McDunn et al. ............... 62/64 |
| 6,104,610 A | * | 8/2000 | Tilton et al. ................. 361/699 |

* cited by examiner

*Primary Examiner*—Gerald Tolin

(57) ABSTRACT

One or more impingement plates, each of which includes one or more apertures, is located within an card cage running from top to bottom and from back to front of the card cage. Each impingement plate is located adjacent to one or more electronic components to be cooled. Channels formed on either side of the impingement plate allow for the ingress of a cooling fluid, the forcing of the cooling fluid through the one or more apertures within the impingement plate toward the electronics to be cooled, and the egress of the cooling fluid after it's contact with the electronics.

21 Claims, 5 Drawing Sheets

ELECTRONIC CIRCUIT COOLING WITH IMPINGEMENT PLATE

FIELD OF THE INVENTION

The invention relates to the cooling of electronic components and, in particular, to the cooling of electronic components housed within an electronics shelf.

BACKGROUND OF THE INVENTION

The speed of electronic components steadily accelerates and, at the same time, increase in density. Additionally, more components are often placed within a single housing than ever before. All these factors: increased speed of operation, increased density of circuitry within a component, and the increased density of components within a housing, contribute to higher operating temperatures. As the temperature of electronic components increase, their reliability decreases. Heat equals failure and it must be dissipated in order to ensure the proper operation of systems that employ components. Various approaches to the cooling of electronic components have been pursued. Forced fluid cooling is described, for example in, U.S. Pat. No. 4,851,965 issued to Garbuzda et al (Garbuzda), which is hereby incorporated by reference. Garbuzda describes the use of jet impingement of air onto the heat generating component through separate plenums. A circuit pack with inboard jet cooling is described in U.S. Pat. No. 5,067,047 issued to Azar, which is hereby incorporated by reference. It has also been suggested that air can be blown onto the components through holes in the enclosures or shields surrounding the circuit components (see, for example, U.S. Pat. No. 4,393,437 issued to Bell et al and U.S. Pat. No. 4,408,255 issued to Adkins, both of which are hereby incorporated by reference. It has been suggested that holes in the circuit boards themselves could allow air to impinge on components in circuit packs which are stacked (see, for example, U.S. Pat. No. 4,399,484 issued to Mayer, which is hereby incorporated by reference).

An electronic cooling system that provides efficient and substantial cooling potential for electronics contained within an electronics shelf would be particularly desirable.

SUMMARY

An electronics cooling system in accordance with the principles of the present invention is directed at electronics that are housed in an electronics shelf. One example of such a shelf is sometimes referred to as a card cage. A card cage is designed to accept printed circuit boards that include electronics components mounted on the boards, with the components interconnected by printed circuit patterns on and within the circuit boards. In accordance with the principles of the present invention one or more impingement plates, each of which includes one or more apertures, is located within the card cage adjacent to one or more of the circuit boards within the card cage.

Channels are formed on either side of an impingement plate (which includes apertures) running from top to bottom and from back to front of the card cage. On a first side of the impingement plate a first channel is formed between the impingement plate and the circuit card that is to be cooled with the aid of the impingement plate. A second channel, on the other, second, side of the impingement plate, may be formed between the impingement plate and another circuit board, and a card cage wall, or with another impingement plate, for example. An ingress path in the form of one or more ingress apertures in the card cage permits a cooling fluid to be forced into the first channel. With no apertures other than those in the impingement plate for egress, the fluid is forced through the apertures toward the circuit board that is to be cooled. An egress path, in the form of one or more egress apertures in the card cage, permits the cooling fluid to escape the second channel. The ingress apertures may be located at the top or bottom of the card cage, for example. Similarly, the egress apertures may be located at the top or bottom of the card cage.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

Figure 1:
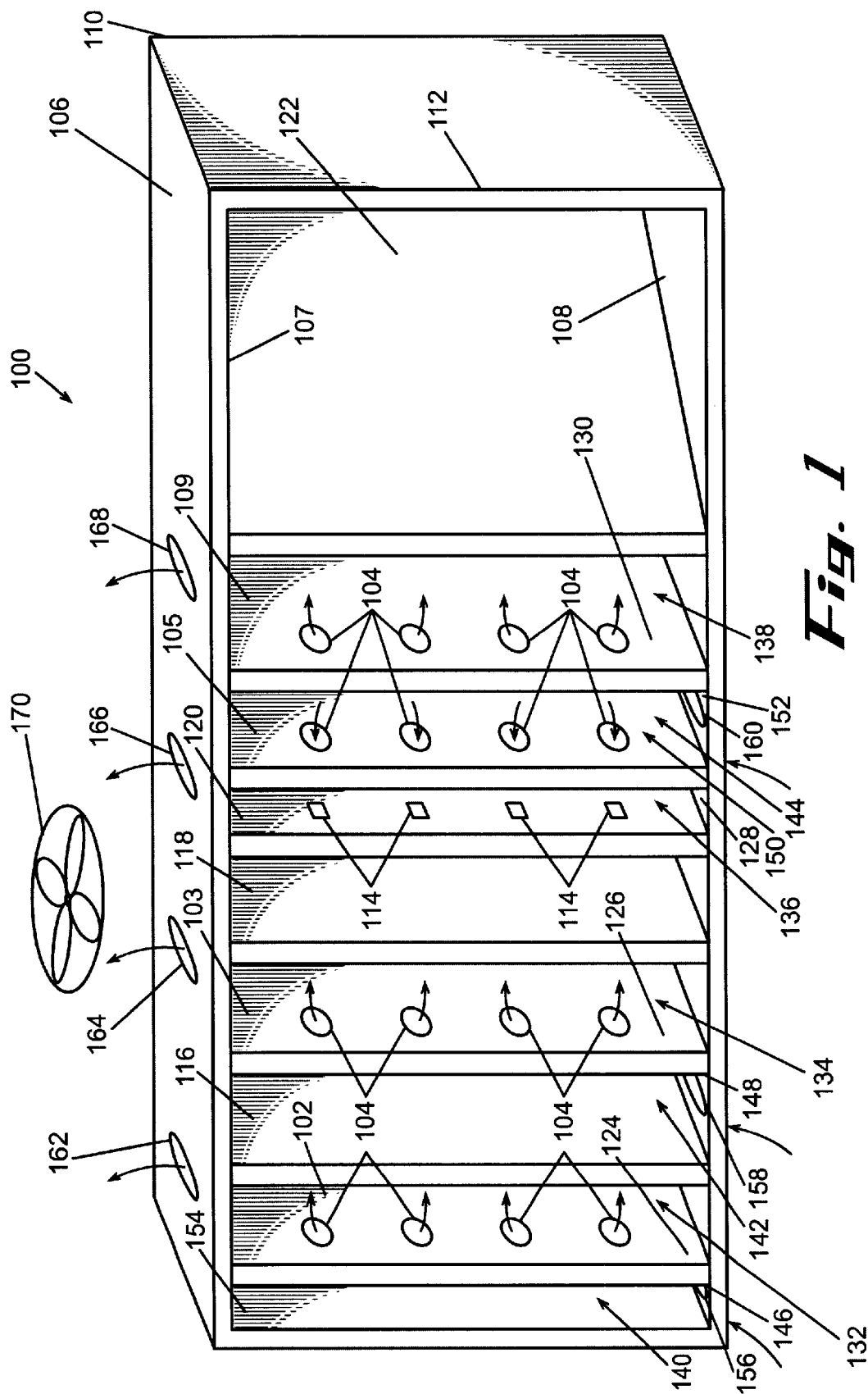
FIG. 1 is a perspective view of an electronics shelf that employs a cooling system in accordance with the principles of the present invention.

In the electronics cooling system 100, in accordance with the principles of the present invention of FIG. 1 one or more impingement plates 102, 103, 105, 109, each of which includes one or more apertures 104, is located within an electronics shelf 106. Each impingement plate 102, 103, 105, 109 extends from top 106 to bottom 108 and from back 110 to front 112 of the electronics shelf 106. Each impingement plate 102, 103, 105, 109 is located adjacent to one or more electronic components 114 to be cooled. Channels formed on either side of an impingement plate 102, 103, 105, 109 allow for the ingress of a cooling fluid, the forcing of the cooling fluid through the one or more apertures 104 within the impingement plate toward the electronics 114 to be cooled, and the egress of the cooling fluid after it's contact with the electronics.

In this illustrative embodiment, the electronics shelf 106 is a card cage designed to accept one or more printed circuit boards 116,118,120,122 that include electronics components 114 mounted on the boards 116,118,120,122, with the components 114 interconnected by printed circuit patterns on and within the circuit boards 116,118,120,122. On first sides 124, 126, 128, 130 of respective impingement plates 102, 103,105,109 first channels 132,134,136,138 are formed between the impingement plate 102,103, 105,109 and respective circuit boards 116,118,120,122 that are to be cooled with the aid of the impingement plate 102, 103, 105, 109. Second channels 140,142,144, on the other, second, side 146, 148, 150, 152 of respective impingement plates 102, 103, 105, 109, may be formed between the impingement plate 102, 103, 105, 109 and another element. In this illustrative embodiment, the "other element" is a circuit board 116, a card cage wall 154, or another impingement plate (105 and 109) for example.

An ingress path including one or more ingress apertures 156, 158,160 in the card cage permits a cooling fluid, such as air or a working fluid, to be forced into the second channels 140,142,144. With no apertures other than those 104 in the impingement plate 102, 103, 105, 109 for egress, the cooing fluid is forced through the apertures 104 toward the circuit boards 116,118,120,122 that are to be cooled. An egress path, including one or more egress apertures 162, 164,166,168 in the card cage 106, permit the cooling fluid to escape the second channel. Although the ingress apertures 156, 158, 160 are illustrated at the bottom of the card cage 106, they could be located at the top of the card cage. Similarly, although the egress apertures 162,164,166,168 are illustrated at the top of the card cage 106, the could be located at the bottom of the card cage.

A fluid mover, such as a fan, 170 may be employed to force the cooling fluid through the ingress apertures 156, 155,160 through the first channels 132, 134, 126, 138, through the apertures 104 into the second channels 140,142, 144, into contact with the electronic components 114, and through the egress apertures 126. The apertures 104, as will be discussed in greater detail below, may be formed to direct cooling fluid toward one or more specific locations on the circuit board 116,118,120,122.

Figure 2:
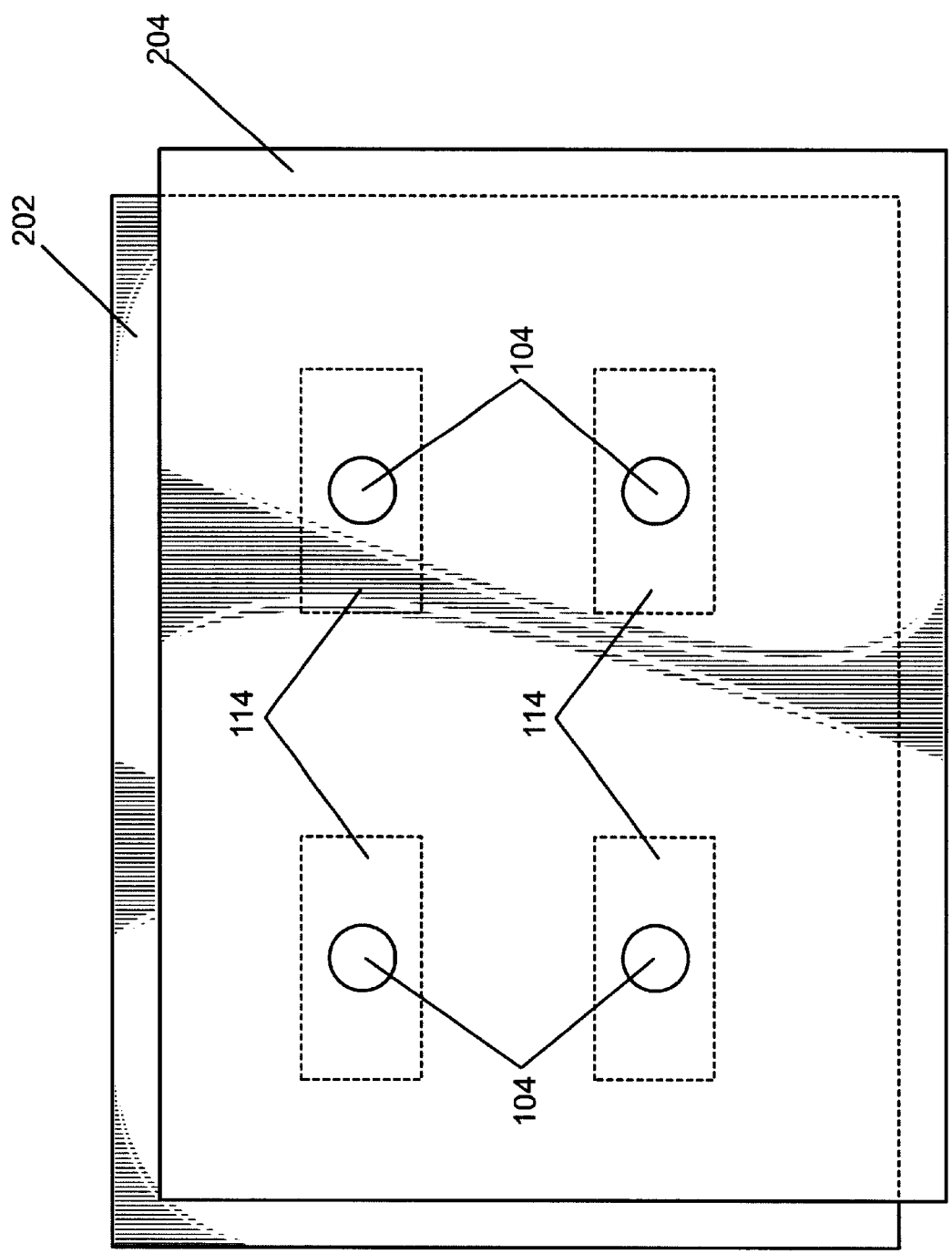
FIG. 2 is a perspective view, with an impingement plate in accordance with the principles of the present invention overlaying a circuit card.

As illustrated in the perspective view of FIG. 2, although the apertures 104 may be arranged to direct cooling fluid in the direction of the circuit board to be cooled in a general fashion, the apertures 104 may also be aligned with the electronic components 114 they are intended to enhance the cooling of. The alignment may be direct, with, for example a jet aperture located directly opposite the center of circuit pack that is to be cooled, or the alignment may include an offset that accounts for the fluid flow across a channel. Although this offset may vary depending on fluid flow rate and distance between the aperture 104 and the circuit board 202, it has been found that directing the flow at a 60 to 70 degree angle with respect to an impingement plate 204 provides effective cooling. The alignment of apertures 104 with components 114 may be achieved, for example, through the use of circuit board layout tools that indicates the placement of electronic components on a circuit board and may be used to determine the corresponding placement of apertures 104 within an impingement plate 204. Those components that generate a particularly generous amount of heat may be selected for one or more corresponding apertures, for example.

Figure 3:
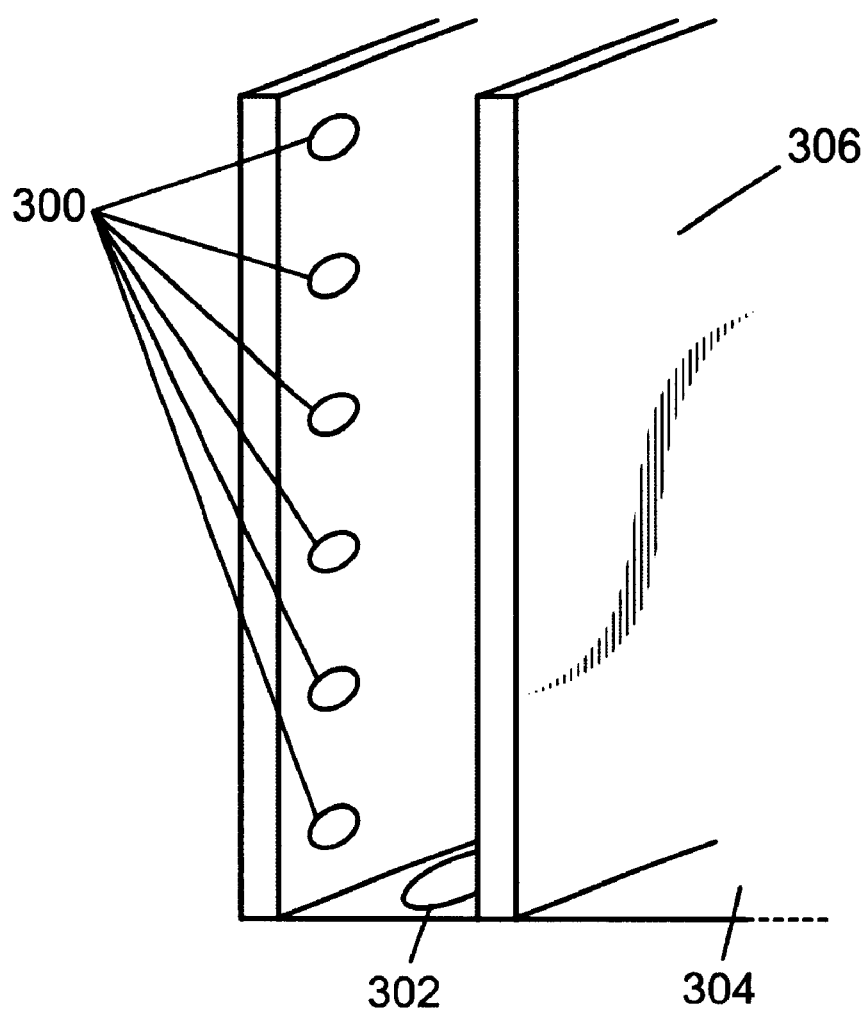
FIG. 3 is a perspective view of an impingement plate in accordance with the principles of the present invention.

As indicated in the perspective view of FIG. 3, the impingement plate apertures 300 may vary in size in order to "pressure-balance" the flow of cooling fluid. In FIG. 3, for example, fluid is forced from through a bottom aperture 302 in a card cage 304 and is directed by apertures 300, toward a circuit board 306. In this illustrative embodiment, in order to balance the fluid flow, the apertures furthest from the source of cooling fluid 302 are larger than those apertures that are closer, providing substantially equal fluid flow through apertures at varying distances from the fluid source 302.

Figure 4A:
FIGS. 4A through 4E are sectional views of various impingement plate aperture profiles.
Figure 4B:
Figure 4C:
Figure 4D:
Figure 4E:
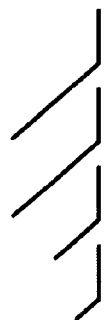
Figure 5:
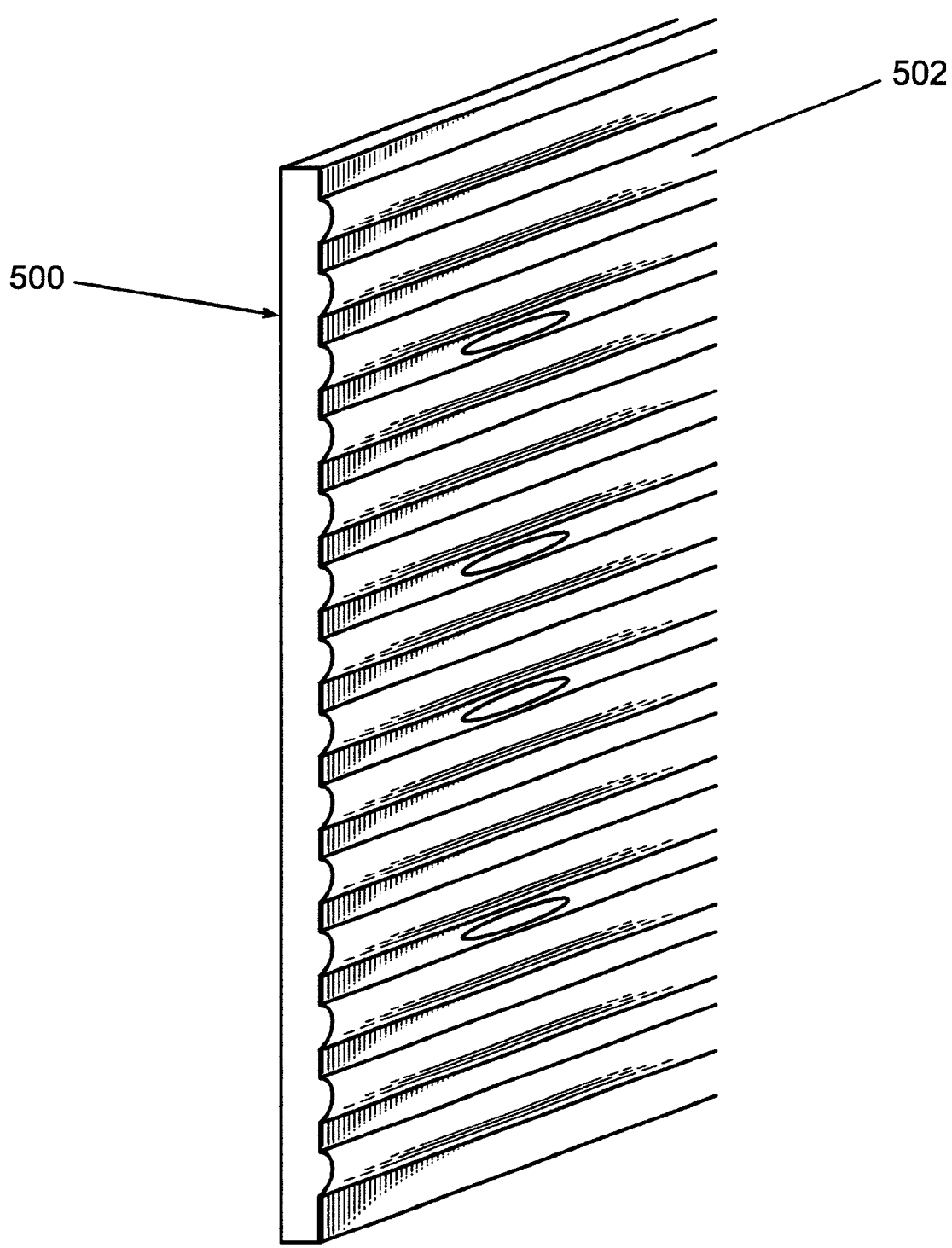
FIG. 5 is a perspective view of an impingement plate in accordance with the principles of the present invention that includes a radiation-absorptive surface.

Apertures within the impingement plate 400 may take on a variety of profiles, including the jets 402 of the cross-sectional view of FIG. 4A, the slanted jets 404 of the cross-sectional view of FIG. 4B, the slits 406 of FIG. 4C, and the louvered apertures 408 of FIG. 4D. Louvered apertures 408 may be sized to pressure balance, by overhanging those louvers closer to the cooling fluid ingress port, as illustrated in FIG. 4E.

In order to further enhance the effectiveness of an impingement plate 500, the surface 502 of the plate facing the electronic components to be cooled may be of a material that absorbs radiant heat, such as a black anodized surface 502. Furthermore, the impingement plate may be formed to increase its surface area and radiant absorption, by corrugating the surface, for example. Radiant heat absorbed by the impingement plate may be conducted through the impingement plate 500 and into the card cage (not shown).

The foregoing description of specific embodiments of the invention has been presented for the purposes of illustration and description. It is not intended to be exhaustive or to limit the invention to the precise forms disclosed, and many modifications and variations are possible in light of the above teachings. For example, although the illustrative embodiments have been described in reference to card cages, the invention may be applied to various other forms of electronic shelves. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A cooling system for cooling electronics housed in a card cage having a top, a bottom, a back and a plurality of card slots, comprising:

an impingement plate having one or more apertures, the impingement plate being mounted within the card cage in a first card slot of the plurality of card slots, and extending from the bottom to the top of the card cage;

a first circuit board mounted within the card cage in a second card slot of the plurality of card slots to a first side of the impingement plate, the first circuit board extending from the bottom to the top of the card cage, the first circuit board having a plurality of electronics mounted thereon, wherein the first circuit board, the impingement plate, and the back of the card cage define a first channel for cooling fluid flow on the first side of the impingement plate;

a second circuit board mounted within the card cage in a third card slot of the plurality of card slots to a second side of the impingement plate, the second circuit board extending from the bottom to the top of the card cage, the second circuit board having a plurality of electronics mounted thereon, wherein the second circuit board, the impingement plate, and the back of the card cage define a second channel for cooling fluid flow on the second side of the impingement plate;

an ingress aperture in the top or bottom of the card cage for fluid flow into the first channel; and an egress aperture in the other of the top or bottom of the card cage for fluid flow out of the second channel, whereby the plurality of electronics mounted on the second circuit board is exposed to cooling fluid flow in the second channel.

2. The cooling system of claim 1 further comprising:

a fluid mover located to force cooling fluid in from the ingress path out through the egress path.

3. The cooling system of claim 1 wherein the ingress path and apertures within the impingement plate are substantially the only means of fluid flow into and out of the first channel.

4. The cooling system of claim 1 wherein the egress path and apertures within the impingement plate are substantially the only means of fluid flow into and out of the second channel.

5. The cooling system of claim 1 wherein the apertures within the impingement plate are aligned with the electronic components of the second circuit board.

6. The cooling system of claim 1 wherein the apertures within the impingement plate are slits.

7. The cooling system of claim 1 wherein the apertures within the impingement plate are jets.

8. The cooling system of claim 1 wherein the apertures are louvered slits.

9. The cooling system of claim 8 wherein the louvers are formed within the first channel and a louver farther from the ingress path overhangs a louver closer to the ingress path.

10. The cooling system of claim 1 wherein at least one of the surfaces of the impingement plate is absorptive of radiant energy.

11. The cooling system of claim 10 wherein the absorptive surface is black anodized aluminum.

12. The cooling system of claim 11 wherein the absorptive surface is corrugated.

13. A cooling system for cooling electronics housed in a card cage having a top, a bottom, a back, a sidewall and a plurality of card slots, comprising:

an impingement plate having one or more apertures, the impingement plate being mounted adjacent the sidewall and within the card cage in a first card slot of the plurality of card slots, and extending from the bottom to the top of the card cage, the impingement plate further being mounted such that the sidewall, impingement plate, and the back of the card cage define a first channel for cooling fluid flow;

a circuit board mounted within the card cage in a second card slot of the plurality of card slots on an opposite side of the impingement plate from the sidewall, the circuit board extending from the bottom to the top of the card cage, the circuit board having a plurality of electronics mounted thereon, wherein the circuit board, the impingement plate, and the back of the card cage define a second channel for cooling fluid flow;

an ingress aperture in the top or bottom of the card cage for fluid flow into the first channel; and an egress aperture in the other of the top or bottom of the card cage for fluid flow out of the second channel, whereby the plurality of electronics of electronics mounted on the circuit board is exposed to cooling fluid flow in the second channel.

14. The cooling system of claim 13 further comprising:

a fluid mover located to force cooling fluid in from the ingress path out through the egress path.

15. The cooling system of claim 13 wherein the ingress path and apertures within the impingement plate are substantially the only means of fluid flow into and out of the first channel.

16. The cooling system of claim 13 wherein the egress path and apertures within the impingement plate are substantially the only means of fluid flow into and out of the second channel.

17. The cooling system of claim 13 wherein the apertures within the impingement plate are aligned with the electronic components of the circuit card.

18. The cooling system of claim 1 wherein the apertures within the impingement plate are slits.

19. The cooling system of claim 13 wherein the apertures within the impingement plate are jets.

20. The cooling system of claim 13 wherein the apertures are louvered slits.

21. The cooling system of claim 20 wherein the louvers are formed within the first channel and a louver farther from the ingress path overhangs a louver closer to the ingress path.

* * * * *